United States Patent [19]
Nakayama

[11] Patent Number: 5,179,535
[45] Date of Patent: Jan. 12, 1993

[54] SUBSTRATE BIAS VOLTAGE GENERATING CIRCUIT INCLUDING AN INTERNAL FREQUENCY DIVIDER AND DRIVEN BY AN EXTERNALLY APPLIED CLOCK SIGNAL

[75] Inventor: Akio Nakayama, Hyogo, Japan

[73] Assignee: Mitsubishi Denki Kabushiki Kaisha, Tokyo, Japan

[21] Appl. No.: 838,648

[22] Filed: Feb. 20, 1992

[30] Foreign Application Priority Data

May 20, 1991 [JP] Japan .................................. 3-114868

[51] Int. Cl.⁵ ............................................ G11C 11/40
[52] U.S. Cl. ........................... 365/189.09; 365/189.04; 365/226; 365/233.5
[58] Field of Search ................ 307/296.2; 365/189.09, 365/189.01, 189.04, 226, 233.5

[56] References Cited

U.S. PATENT DOCUMENTS 4,494,223  1/1985  Reddy et al. ........................ 365/185

Primary Examiner—Terrell W. Fears
Attorney, Agent, or Firm—Lowe, Price, LeBlanc & Becker

[57] ABSTRACT

A substrate bias generating circuit improved for a DRAM is disclosed. The substrate bias generating circuit is driven by an externally applied signal /RAS, and a drive pulse signal is divided by a newly provided frequency division circuit. A ratio of division of the frequency division circuit is so set that power consumed by a substrate bias generating circuit is minimized under the requirement that a potential of a substrate of the DRAM should be kept within a permissible range. Therefore, a potential of the semiconductor substrate can be kept within a permissible range under less power consumption.

13 Claims, 10 Drawing Sheets

SUBSTRATE BIAS VOLTAGE GENERATING CIRCUIT INCLUDING AN INTERNAL FREQUENCY DIVIDER AND DRIVEN BY AN EXTERNALLY APPLIED CLOCK SIGNAL

BACKGROUND OF THE INVENTION

1. Field of the Invention

The invention relates generally to a substrate bias generating circuit and, more particularly, to a substrate bias generating circuit driven in response to an externally applied clock signal. The invention has particular applicability to dynamic random access memories (DRAMs).

2. Description of the Background Art

Generally, a semiconductor device such as a dynamic random access memory (referred to as "DRAM" hereinafter) and a static random access memory (SRAM) is constituted by many MOS transistors formed on a semiconductor substrate. In such a semiconductor device, normally, it is desirable to maintain a potential of a semiconductor substrate to be constantly within a predetermined range. The reason will be described below.

FIG. 5 is a block diagram of a semiconductor integrated circuit device in general. Referring to FIG. 5, the semiconductor device 100 comprises a function circuit (or an internal circuit) formed on a single semiconductor substrate and a substrate bias generating circuit 120. Function circuit 110 is constituted by many MOS transistors in order to implement functions needed in semiconductor device 100. Semiconductor bias generating circuit 120 is also constituted by MOS transistors and generates a substrate bias voltage $V_{BB}$ in order to maintain a semiconductor substrate 130 at a predetermined negative potential.

FIG. 6 shows one part of a cross sectional structure of a general semiconductor integrated circuit device. Function circuit 110 shown in FIG. 5 also comprises the cross sectional structure shown in FIG. 6. A MOS transistor and interconnection formed on the periphery thereof are shown as one example in FIG. 6. Referring to FIG. 6, a MOS transistor comprises N type impurity regions 131 and 132 forming a source and a drain formed close to a main surface of a P type semiconductor substrate 130, and a gate electrode 133. A gate oxide film 134 is formed between gate electrode 133 and substrate 130. A channel is formed between source region 131 and drain region 132 depending on a voltage applied to gate electrode 133. An N type impurity region 135 forming an interconnection region is formed to be spaced apart from impurity region 131 and close to substrate 130. On a surface of substrate 130 between impurity regions 131 and 135, a signal line 136 is formed with a thick filter insulating film 137 interposed therebetween.

In operation, when the MOS transistor is rendered conductive, hot electron-hole pairs are generated in the vicinity of drain 132. Most of the generated hot electrons flow into drain 132. Most of holes flow into substrate 130. A potential of substrate 130 rises as a result. The rise of a potential of substrate 130 causes the following problems.

PN junctions are formed between source region 131 and P type substrate 130 and between drain region 132 and P type substrate 130. These PN junctions are brought into a forward biased state. In addition, a PN junction between interconnection region 135 and substrate 130 is also brought into a forward biased state. Therefore, leakage current flows between source region 131 and substrate 130, between drain region 132 and substrate 130, between interconnection region 135 and substrate 130. As a result, the channel between source region 131 and drain region 132 is not formed or a signal transmitted through interconnection region 135 is delayed.

In addition, when a signal at a high level, that is, a power supply voltage level is transmitted through interconnection 136, a channel depending on a potential of interconnection 136 is liable to be formed close to the surface of substrate 130 between impurity regions 131 and 135 by the rise of a potential of substrate 130. That is to say, a parasitic MOS transistor is formed by interconnection 136, insulating film 137, N type regions 131 and 135. When the parasitic transistor operates, the normal operation of function circuit 110 shown in FIG. 5 is prevented.

Additionally it should be pointed out that the rise of a potential of substrate 130 changes a threshold voltage Vth of a MOS transistor. FIG. 7 is a graph showing a relationship between a threshold voltage Vth of an NMOS transistor formed on a P type semiconductor substrate and a potential $V_{BB}$ of a P type semiconductor substrate. Referring to FIG. 7, when substrate potential $V_{BB}$ is in a low range, that is, $-V1 < V_{BB} < -V2$, threshold voltage Vth is kept almost constant. When substrate potential $V_{BB}$ rises ($V_{BB} > -V1$), however, threshold voltage Vth varies in response to a value of $V_{BB}$. This implies that the rise of substrate potential $V_{BB}$ prevents the MOS transistor from performing stable operation. In other words, function circuit 110 shown in FIG. 5 causes malfunction by the rise of substrate potential $V_{BB}$.

Therefore, in order to prevent the above problems, a substrate bias generating circuit 120 is provided to keep potential $V_{BB}$ of substrate 130 in a predetermined range ($-V1 < V_{BB} < -V2$).

The substrate bias generating circuit is also provided for a DRAM, for example. FIG. 8 is a block diagram of a conventional DRAM. Referring to FIG. 8, the DRAM 1 comprises a memory cell array 85 including many memory cells, an address buffer 81 receiving externally applied address signals A0 through An, a row decoder 82 and a column decoder 83 for designating a row and a column of memory cell array 85, respectively, in response to the received address signals, and a sense amplifier 84 for amplifying a data signal read from a memory cell. An input data Di is applied through a data in buffer 86. An output data Do is output through a data out buffer 87. DRAM 1 comprises a clock generator 88 generating a clock signal for controlling various circuits provided therein.

The DRAM further comprises two substrate bias generating circuits 89 and 93 for generating the above mentioned substrate bias voltage $V_{BB}$. Substrate bias generating circuit 89 comprises a ring oscillator not shown, and is constantly driven by a clock signal generated from the ring oscillator after a power supply voltage Vcc is supplied.

Substrate bias generating circuit 93 is driven by an externally applied row address strobe signal /RAS. RAS input buffer 92 receives an externally supplied signal /RAS and applies the received signal to clock generator 88 and substrate bias generating circuit 93. Circuit 93 is driven by the applied signal and generates substrate bias voltage $V_{BB}$.

The reason why DRAM 1 comprises circuit 93 in addition to substrate bias generating circuit 89 will be stated below. Generally, a DRAM is brought into a standby state and an active state in response to externally applied clock signals /RAS and /CAS, etc. In the active state, a normal read operation, a write operation, a read modify write operation, a static column mode operation, a page mode operation, etc. are performed. In the activating state, many circuits within DRAM 1 shown in FIG. 8 are activated, while only a few circuits are activated in a standby state. This implies that, compared to the standby state, a substrate potential is likely to rise in the activating state. Therefore, it is necessary to maintain the substrate potential more firmly at a low potential in the active state. Hence, circuit 93 driven in the active state and generating substrate bias voltage $V_{BB}$ is additionally provided. Circuit 93 is driven by a signal /RAS varying frequently in the active state. Although in the example shown in FIG. 8, substrate bias generating circuit 93 is driven by signal /RAS, circuit 93 may be driven by an externally applied column address strobe signal /CAS in some cases.

Substrate bias generating circuit 93 driven by signal /RAS was described above. A substrate bias generating circuit 95 driven by an address transition detection (referred to as "ATD" hereinafter) pulse is provided in some cases. An ATD circuit 94 detects a transition of external address signals A0 through An applied to an address buffer 81 and generates an ATD pulse. Substrate bias generating circuit 95 is driven by the ATD pulse and generates voltage $V_{BB}$. Substrate bias generating circuit 95 generates voltage $V_{BB}$ in the active state of DRAM 1 similarly to circuit 93; however, circuit 95 is particularly characterized in that it can generate voltage $V_{BB}$ even when a signal /RAS does not vary as in a static column mode. Even though the static column mode is included as the activating state, circuit 93 is not driven because signal /RAS is constant in this mode. However, the ATD pulse is generated even in this mode, so that circuit 95 can generate voltage $V_{BB}$. It is pointed out that a conventional DRAM comprises either circuits 93 or 95 in addition to substrate bias generating circuit 89.

DRAMs and SRAMs are employed in various electrical appliances such as a personal computer. Since, particularly in recent years, many DRAMs are used in portable electrical appliances such as a notebook type personal computer, it is strongly desired that power consumed by a DRAM is reduced. Therefore, it is pointed out that there is a need to decrease power consumption also in a substrate bias generating circuit.

FIG. 9 is a circuit diagram of substrate bias generating circuit 93 shown in FIG. 8. Referring to FIG. 9, the substrate bias generating circuit 93 comprises cascaded inverters 25 and 26 for shaping a waveform of an input clock signal $\phi 4$, a NAND gate 16 for outputting clock signals inverted from each other, a NOR gate 17, an inverter 18, and two charge pump circuits 50 and 51. Externally applied signal /RAS is received by RAS input buffer 92. The received input signal /RAS is applied to clock generator 88. Input signal /RAS is applied also to substrate bias generating circuit 93 as the above mentioned signal $\phi 4$.

FIG. 10 is a timing chart for describing operation of substrate bias generating circuit 93 shown in FIG. 9. Referring to FIGS. 9 and 10, the operation of substrate bias generating circuit 93 will be described below. Input clock signal $\phi 4$ is applied, so that a potential of node E changes as shown in FIG. 10. Therefore, potentials of an output node F of NAND gate 16 and an output node C of NOR gate 17 also change as shown in FIG. 10. Since an output signal of NOR gate 17 is inverted by inverter 18, an output node G of inverter 18 changes as shown in FIG. 10. Charge pump circuits 50 and 51 respectively receive clock signals which are obtained from input clock signal $\phi 4$ and inverted from each other.

Charge pump circuit 50 comprises a capacitor 20 connected in series between output node G of inverter 18 and substrate 130, and a PMOS transistor 23. A PMOS transistor 24 is connected between a connection node I of capacitor 20 and transistor 23, and ground. Similarly, charge pump circuit 51 also comprises a capacitor 19 and a PMOS transistor 21 connected in series between output node F of NAND gate 16 and substrate 130. A PMOS transistor 22 is connected between a connection node H of capacitor 19 and transistor 21, and ground. Each of transistors 23 and 21 is diode connected. The on and off of transistor 22 is controlled by a potential of node I. The on and off of transistor 24 is controlled by a potential of node H. An output voltage of NAND gate 16 is applied to back gates of transistors 21 and 22. An output voltage of inverter 18 is applied to back gates of transistors 23 and 24.

In charge pump circuit 50, when a potential of node G falls from power supply potential Vcc to a ground potential, a potential of node I also start to fall by coupling of capacitor 20. On the other hand, in charge pump circuit 51, when a potential of node F rises from ground potential to power supply potential Vcc, a potential of node H starts to rise by coupling of capacitor 19. When transistor 24 is turned on by the rise of a potential of node H, a discharging path of capacitor 20 is cut off and negative charges discharged from capacitor 20 start to be stored in node I. As a result, a potential of node I starts to fall below the ground potential and finally becomes a negative potential having the same value as that of power supply potential Vcc $(= -Vcc)$. Therefore, transistor 23 is turned on, so that a voltage $(= -Vcc + Vthp)$ higher than the potential of node I $(= -Vcc)$ by threshold voltage Vthp of a PMOS transistor is applied to substrate 103 as substrate bias voltage $V_{BB}$. Transistor 22 is rendered conductive in response to a fall of the potential of node I, so that the potential of node H is higher than a potential of node K $(= -Vcc + Vthp)$. Therefore, transistor 21 is turned off. Transistor 23 is rendered conductive, so that a negative voltage $(= -Vcc + Vthp)$ is supplied to substrate 130 and transistor 21 is held off in a period when the potential of node G is low (a period when the potential of node F is high).

Conversely, when a potential of node F falls, charge pump circuit 51 operates in the same manner as charge pump circuit 50 does when a potential of node G falls. When the potential of node F falls from power potential Vcc to the ground potential, a potential of node H also starts to fall by coupling of capacitor 19. In charge pump circuit 50, a potential of node I rises in response to a rise of the potential of node G, so that transistor 22 is turned off. Consequently, a discharging path of capacitor 19 is cut off, and the potential of node H falls to a negative potential $(= -Vcc)$ having the same absolute value as that of power supply potential Vcc. As a result, a potential of node K becomes finally higher than the potential of node H by threshold voltage Vthp $(= -Vcc + Vthp)$. In charge pump circuit 50, transistor 24 is rendered conductive by a fall of the potential of node H of charge pump circuit 51, and node I is brought into the ground potential. Therefore, transistor 23 is turned off. The state in which transistor 23 is held off and transistor 21 outputs a negative voltage (=−Vcc+Vthp) to substrate 130 is maintained in a period when the potential of node F is low (a period when the potential of node G is high).

Two charge pump circuits 50 and 51 shown in FIG. 9 are driven in response to two applied clock signals. Consequently, substrate bias generating circuit 93 generates voltage $V_{BB}$ (=−Vcc+Vthp) constantly having a negative value.

FIG. 11 is a circuit diagram of substrate bias generating circuit 95 shown in FIG. 8. Referring to FIG. 11, the substrate bias generating circuit 95 receives the ATD pulse generated from ATD circuit 94 as input clock signal $\phi3$. Therefore, internal signal /RAS output from RAS input buffer 92 is not applied to circuit 95. ATD circuit 94 outputs ATD pulse $\phi3$ in response to a transition of external address signals A0 through An applied to address buffer 81. Since circuit 94 has the same circuit configuration and operates in the same manner as circuit 93 does, the description is not repeated.

As above described, substrate bias generating circuits 93 and 95 are driven in response to applied clock signals $\phi4$ and $\phi3$, the applied clock signals $\phi4$ and $\phi3$ have high frequencies, and hence, the following problem arises. First, it should be pointed out that inverters 25 and 26 for shaping a waveform receives input clock signals $\phi4$ and $\phi3$ having the high frequencies, so that power consumption is increased. Generally, an inverter consumes more current when a state of itself is inverted. This means that the larger the number of repetition of inversion of an inverter is, the more power is consumed. Inverters 25 and 26 shown in FIGS. 9 and 11 are operated in response to clock signals $\phi4$ and $\phi3$ having high frequencies, so that power consumption of substrate bias generating circuits 93 and 95 is increased.

Secondly, charge pump circuits 50 and 51 perform charge pump operation alternately as described above. It should be also pointed out that efficiency in the charge pump operation is decreased. Capacitors 19 and 20 provided within charge pump circuits 50 and 51 for the charge pump operation repeat charging/discharging. When the frequency of an input clock signal is high, capacitors 19 and 20 cannot perform sufficient charging/discharging. In other words, because charging/discharging of capacitors 19 and 20 are performed in a short clock period, sufficient charging/discharging of capacitors 19 and 20 are not carried out. As a result, charge pump efficiency in charge pump circuits 50 and 51 is decreased.

SUMMARY OF THE INVENTION

One object of the invention is to reduce power consumed in a substrate bias voltage generating circuit.

Another object of the invention is to keep a potential of the semiconductor substrate in a permissible range under less power consumption in a semiconductor integrated circuit device.

Another object of the invention is to enhance generation efficiency of a substrate bias voltage generated by two alternately driven charge pump circuits.

Yet another object of the invention is to decrease an operation speed needed for two alternately driven charge pump circuits.

Still another object is to reduce power consumed in a semiconductor memory device.

Another object of the invention is to reduce power consumed in a dynamic random access memory device.

Briefly described, a substrate bias voltage generating circuit according to the invention includes a semiconductor substrate, an internal circuit formed on the substrate, an internal clock signal generating circuit generating an internal clock signal for controlling the internal circuit in response to an externally applied clock signal, a frequency divider circuit dividing the internal clock signal by a predetermined ratio of division, and a substrate bias voltage generating circuit driven by the divided internal clock signal and generating a substrate bias voltage for keeping a potential of the substrate within a predetermined range.

In operation, the divider circuit divides the internal clock signal obtained from the externally applied clock signal. The substrate bias voltage generating circuit is driven by the divided internal clock signal and maintains the potential of the substrate within the predetermined range. The frequency of the clock signal for driving the substrate bias voltage generating circuit is determined by the ratio of division of the frequency divider circuit, so that necessary power consumption can be prevented and the potential of the substrate can be kept in a predetermined range.

According to another aspect of the invention, a semiconductor integrated circuit device includes a semiconductor substrate, a function circuit formed on the substrate, an internal clock signal generating circuit generating an internal clock signal for controlling the function circuit in response to an externally applied clock signal, a frequency divider circuit dividing the generated internal clock signal by a predetermined ratio of division, and a substrate bias voltage generating circuit driven by the divided internal clock signal and keeping the substrate potential within the predetermined range.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
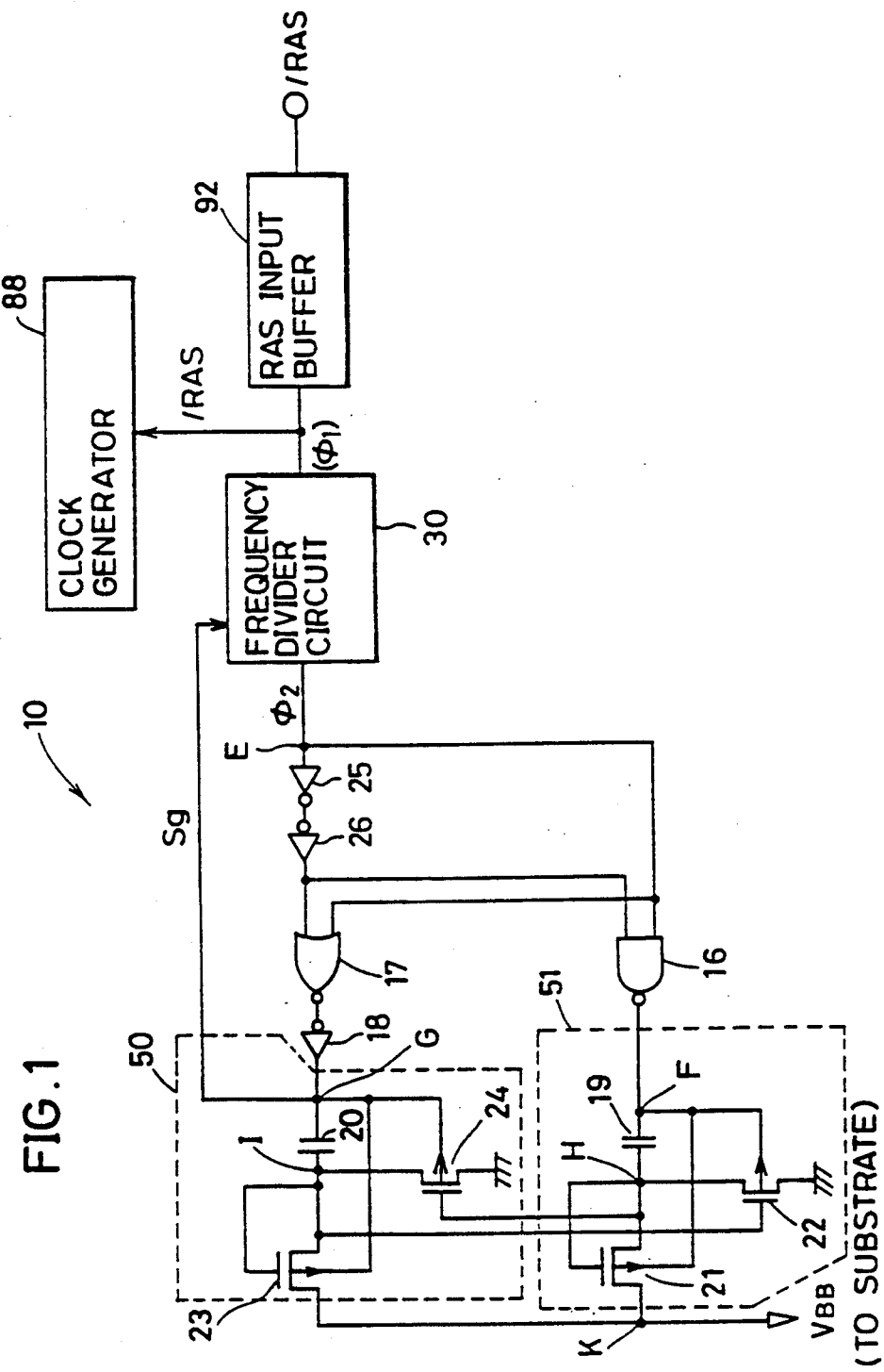
FIG. 1 is a circuit diagram of a substrate bias generating circuit showing one embodiment of the invention.
Figure 9:
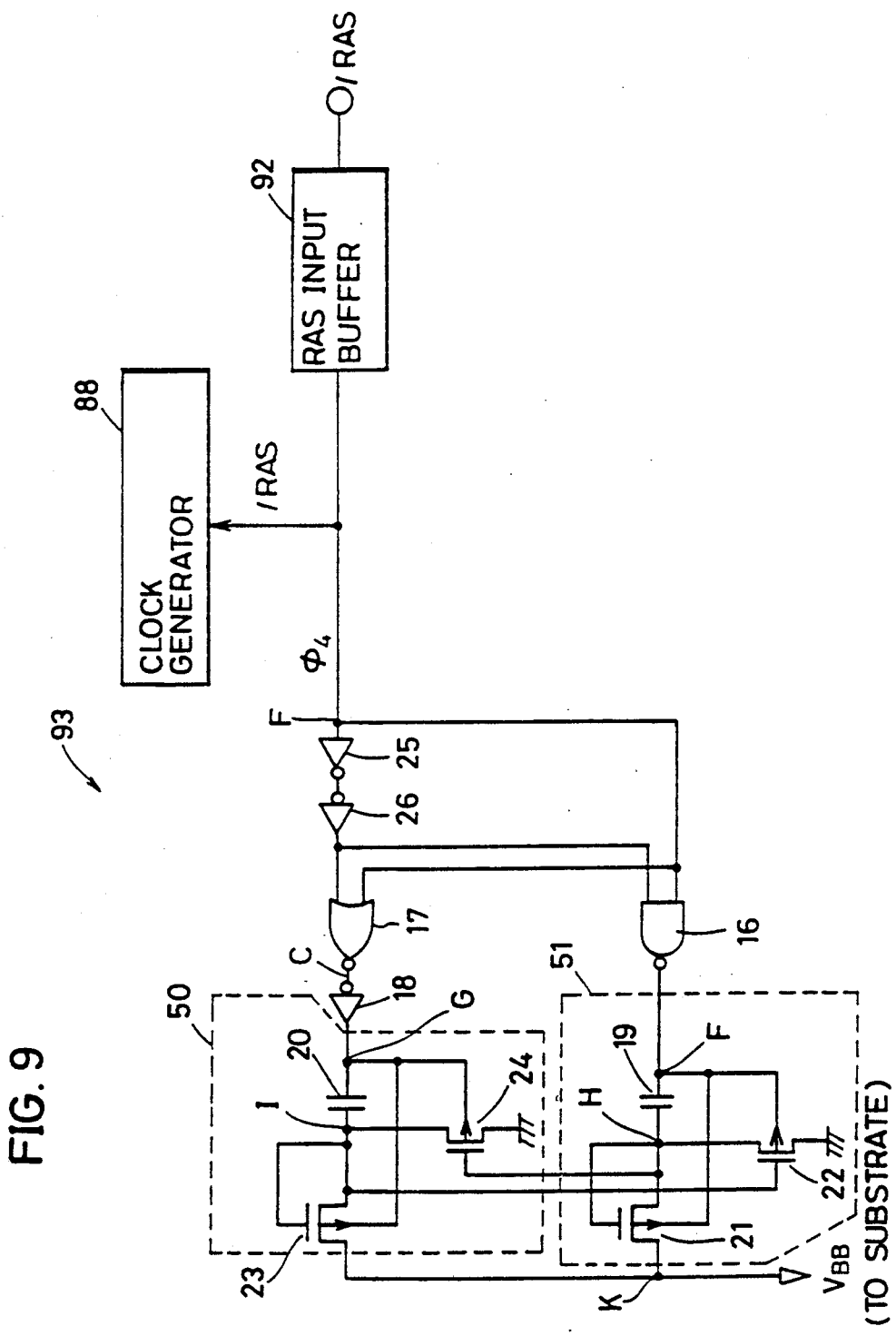
FIG. 9 is a circuit diagram of a substrate bias generating circuit shown in FIG. 8.
Figure 10:
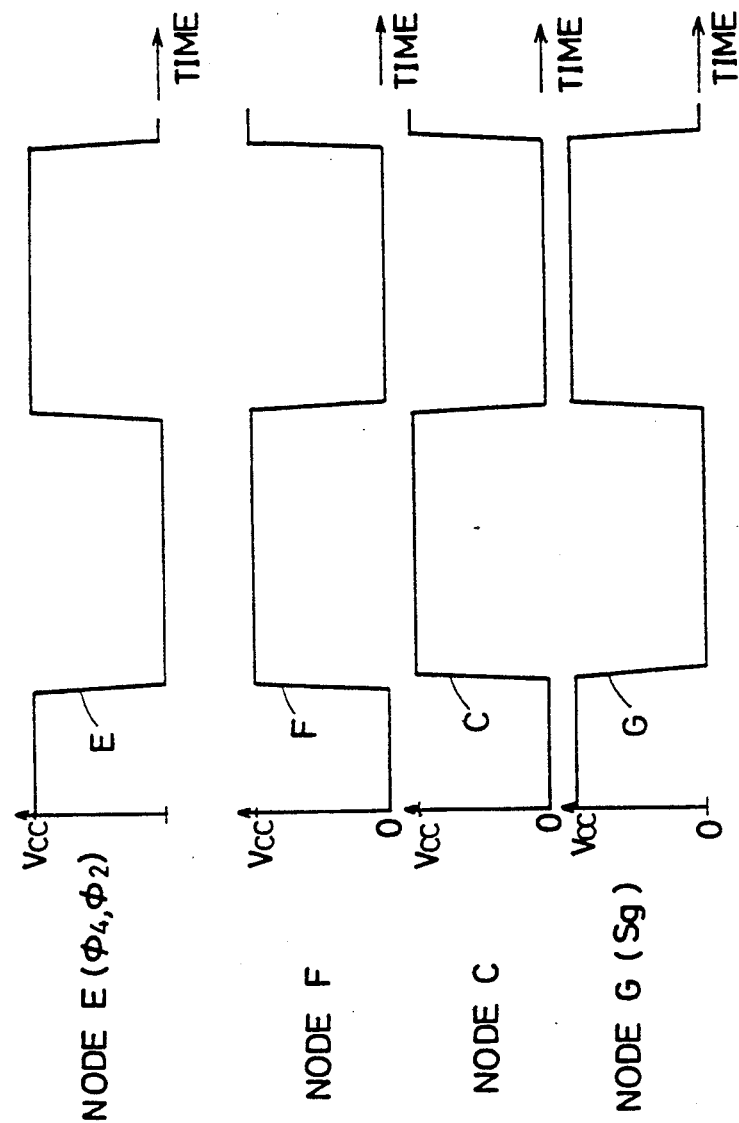
FIG. 10 is a timing chart for describing operation of a substrate bias generating circuit shown in FIG. 9.
Figure 11:
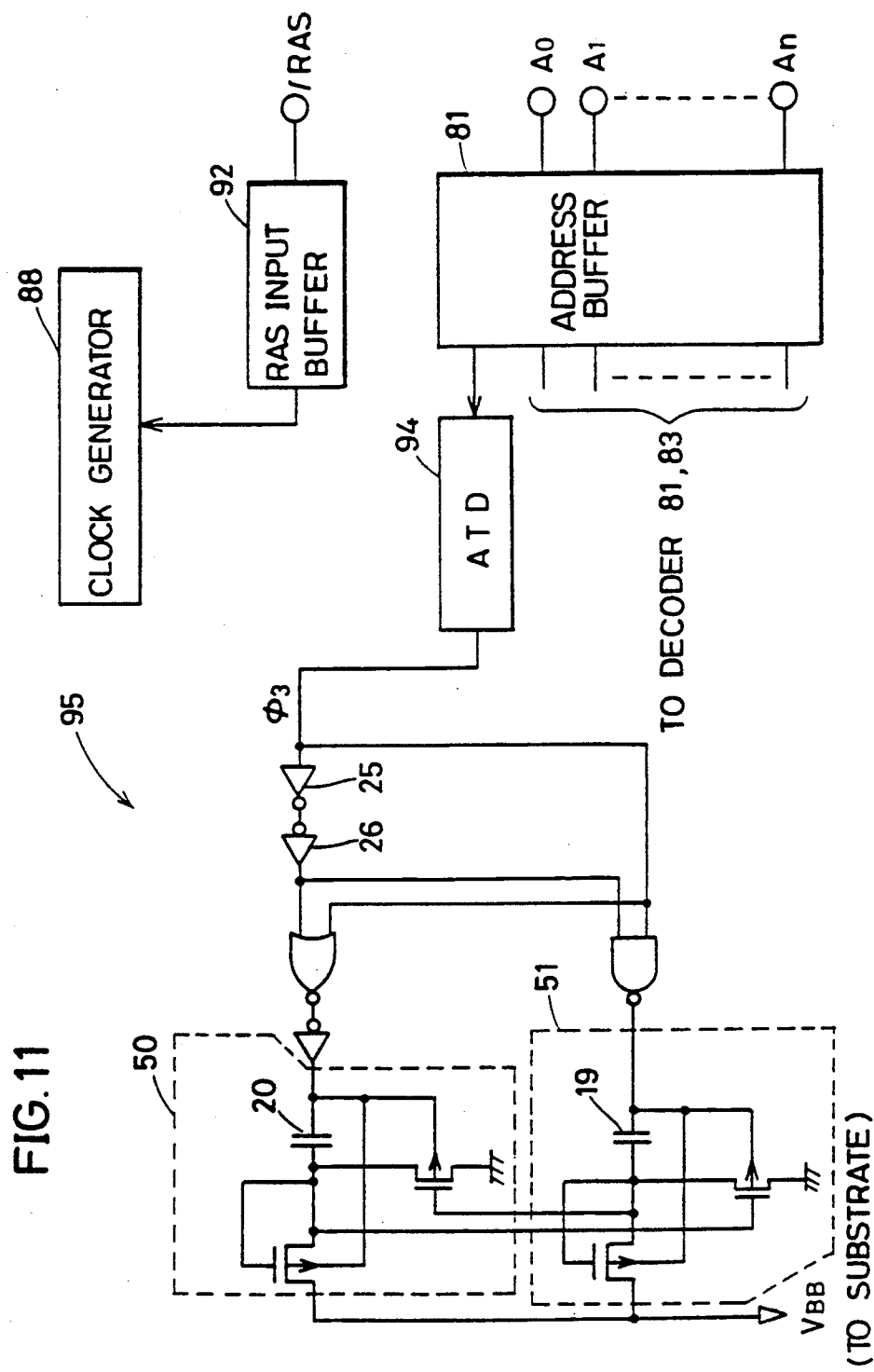
FIG. 11 is a circuit diagram of substrate bias generating circuit 95 shown in FIG. 8.

Referring to FIG. 1, a frequency division circuit 30 is provided at a preceding stage to a substrate bias generating circuit 10. A signal /RAS is applied to a RAS input buffer 92. RAS input buffer 92 outputs an internal signal /RAS in response to an externally applied signal /RAS, and applies it to a clock generator 88 and frequency division circuit 30. Frequency division circuit 30 receives the applied internal signal /RAS as an input clock signal $\phi1$. In addition, frequency division circuit 30 is connected to receive a signal Sg defining one divided period which is output from a charge pump circuit 50. Frequency division circuit 30 divides input clock signal $\phi1$ by a predetermined ratio of division and applies the divided output clock signal $\phi2$ to substrate bias generating circuit 10. Substrate bias generating circuit 10 is driven by an applied clock signal $\phi2$ and supplies a substrate bias voltage $V_{BB}$ to a substrate not shown. Operation of substrate bias generating circuit 10 is the same as that of the conventional circuit 93 shown in FIG. 9, and therefore the description is not repeated.

Figure 2:
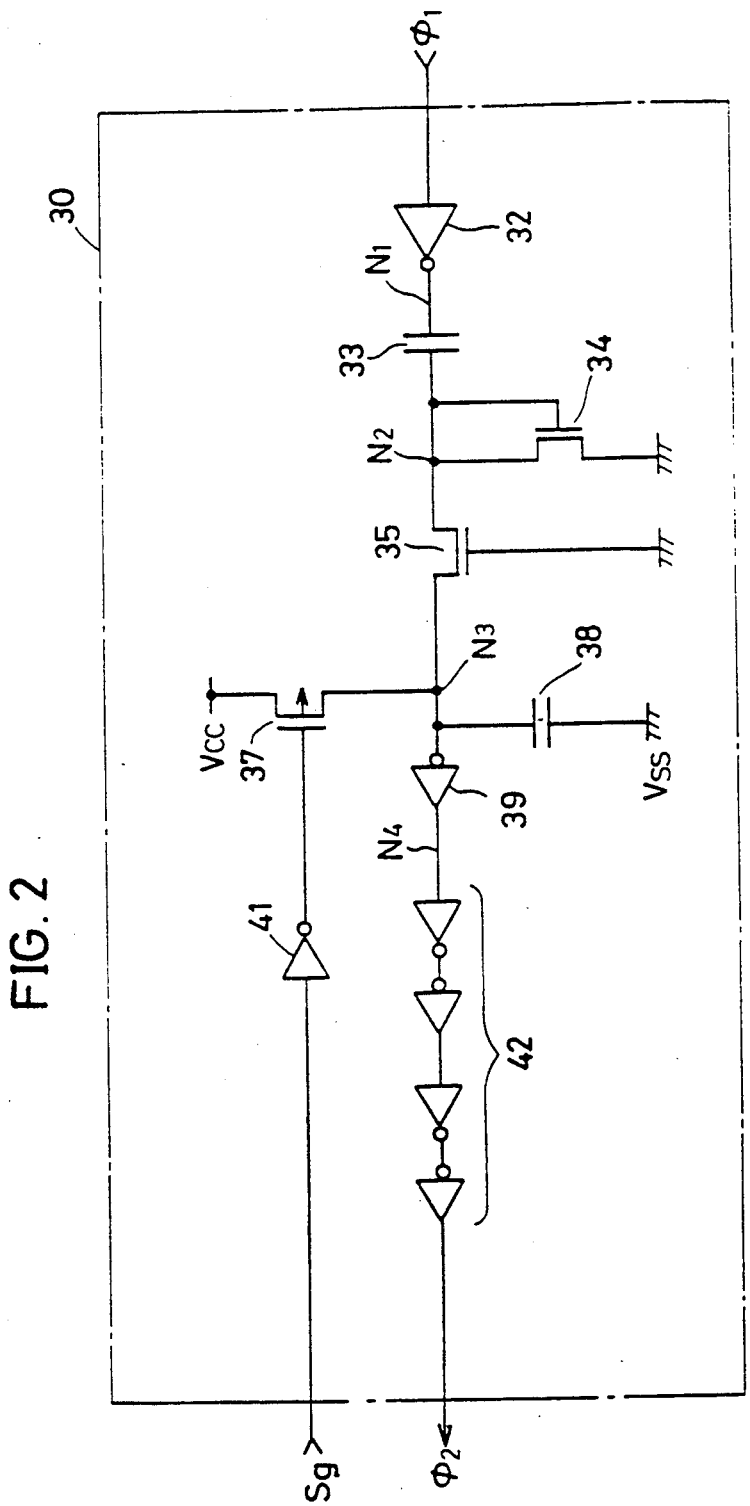
FIG. 2 is a circuit diagram of a frequency division circuit shown in FIG. 1.
Figure 3:
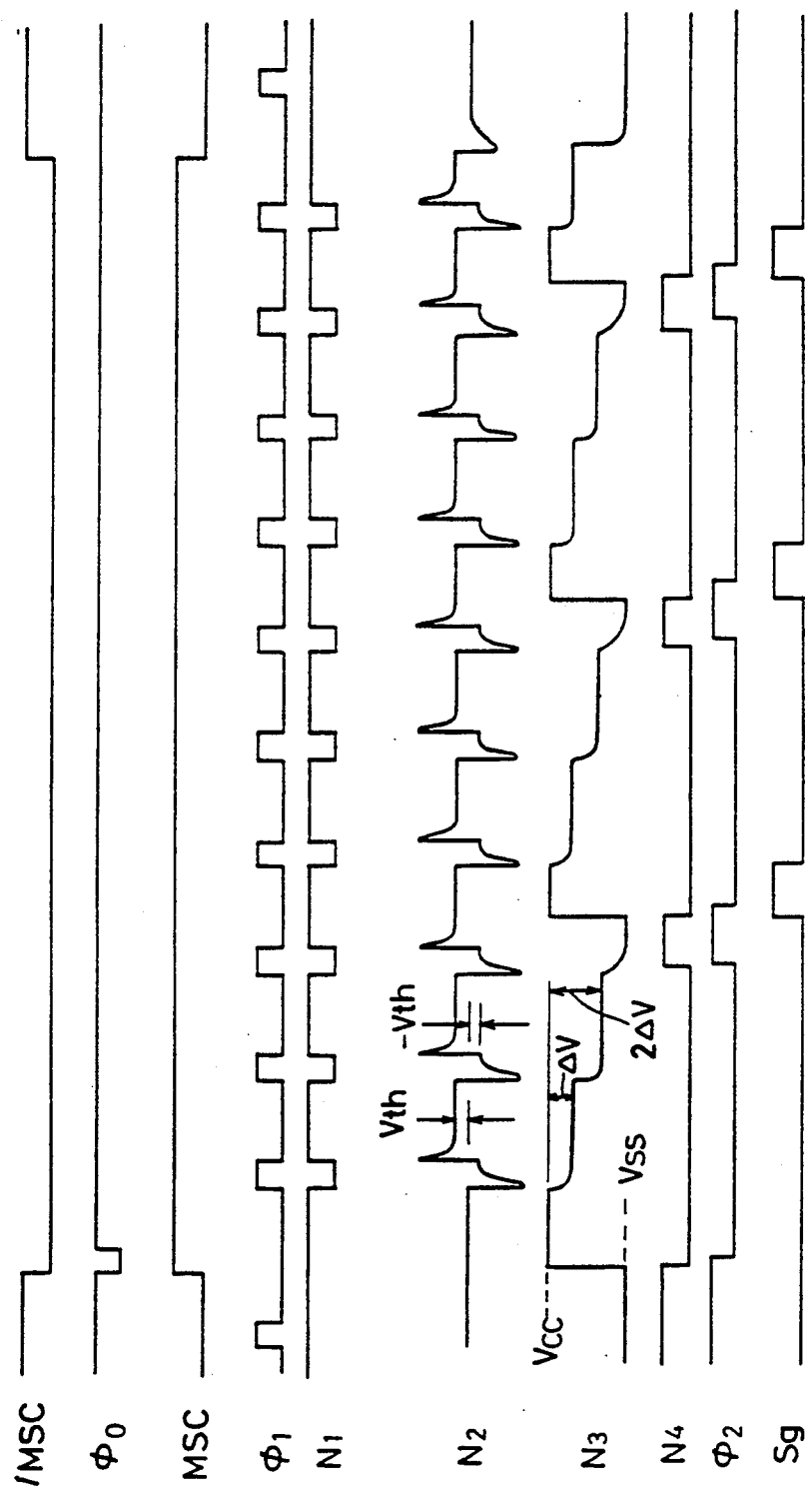
FIG. 3 is a timing chart for describing operation of the frequency division circuit shown in FIG. 2.

One example of frequency division circuit 30 shown in FIG. 1 is shown in FIG. 2. Referring to FIG. 2, the frequency division circuit 30 comprises inverters 32, 39, 41 and 42, capacitors 33 and 38, NMOS transistors 34 and 35, and a PMOS transistor 37. A timing chart for describing operation of frequency division circuit 30 is shown in FIG. 3. Referring to FIGS. 2 and 3, operation of frequency division circuit 30 will be described below.

First, it is assumed that a node N3 has a potential of a Vcc level. A potential of node N1 changes in response to an input clock signal $\phi1$ applied through inverter 32. When the potential of node N1 attains high, a potential of node N2 is apt to rise; however, transistor 34 turns on and the potential of node N2 reaches Vth. It is assumed that each of transistors 34 and 35 has the same threshold voltage Vth. Conversely, when the potential of node N1 attains low, the potential of node N2 reaches $-Vcc+Vth$. When the potential of node N2 reaches below $-Vth$, charges stored in node N3 flow into node N2 through transistor 35. It is assumed that capacitor 38 has a capacitance value several times that of capacitor 33. Therefore, node N2 is charged and the potential of node N2 reaches $-Vth$. Therefore, the potential of node N3 decreases from Vcc to $Vcc-\Delta V$. The potential of node N3 is reduced by $\Delta V$ in one period of input clock signal $\phi1$. Therefore, in the next period of input clock signal $\phi1$, the potential of node N3 is further reduced by $\Delta V$. The potential of node N3 reaches $Vcc-3\Delta V$ ($\approx Vss$) in the period after next. When the potential of node N3 reaches almost Vss, the potential of node N4 becomes high. Therefore an output clock signal $\phi2$ attains a high level.

Output clock signal $\phi2$ is applied to substrate bias generating circuit 10 shown in FIG. 1. A signal Sg at node G of charge pump circuit 50 provided within substrate bias generating circuit 10 is applied to frequency division circuit 30. The applied signal Sg is applied to the gate of transistor 37 through inverter 41 as shown in FIG. 2. Signal Sg includes a pulse of high level for every four periods of input clock signal $\phi1$, so that transistor 37 is turned on in response to the pulse. Therefore, node N3 is charged to a potential of Vcc level once for every four periods of input clock signal $\phi1$.

Repetition of the above operation results in output clock signal $\phi2$ divided to be $\frac{1}{4}$ of applied input clock signal $\phi1$ can be obtained.

Figure 8:
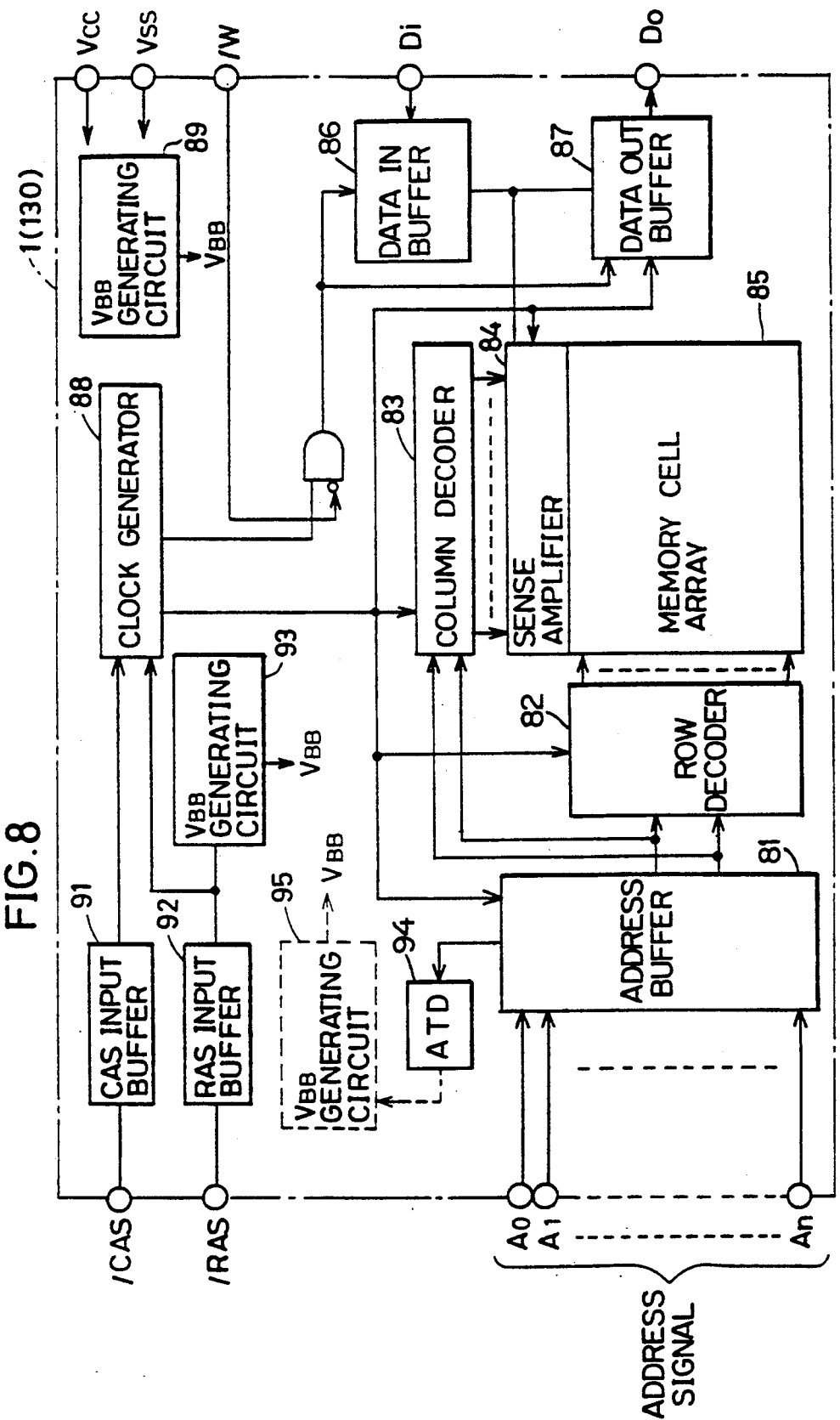
FIG. 8 is a block diagram of a conventional DRAM.

Frequency division circuit 30 shown in FIG. 1 receives an output clock signal $\phi1$ from a RAS input buffer 92; however, it is pointed out that it is possible to supply an output signal from CAS input buffer 91 shown in FIG. 8 in place of RAS input buffer 92. Further, it is also pointed out that, in some cases, ATD pulse generated from an address transition detector (ATD) can be supplied in place of RAS input buffer 92.

Figure 4:
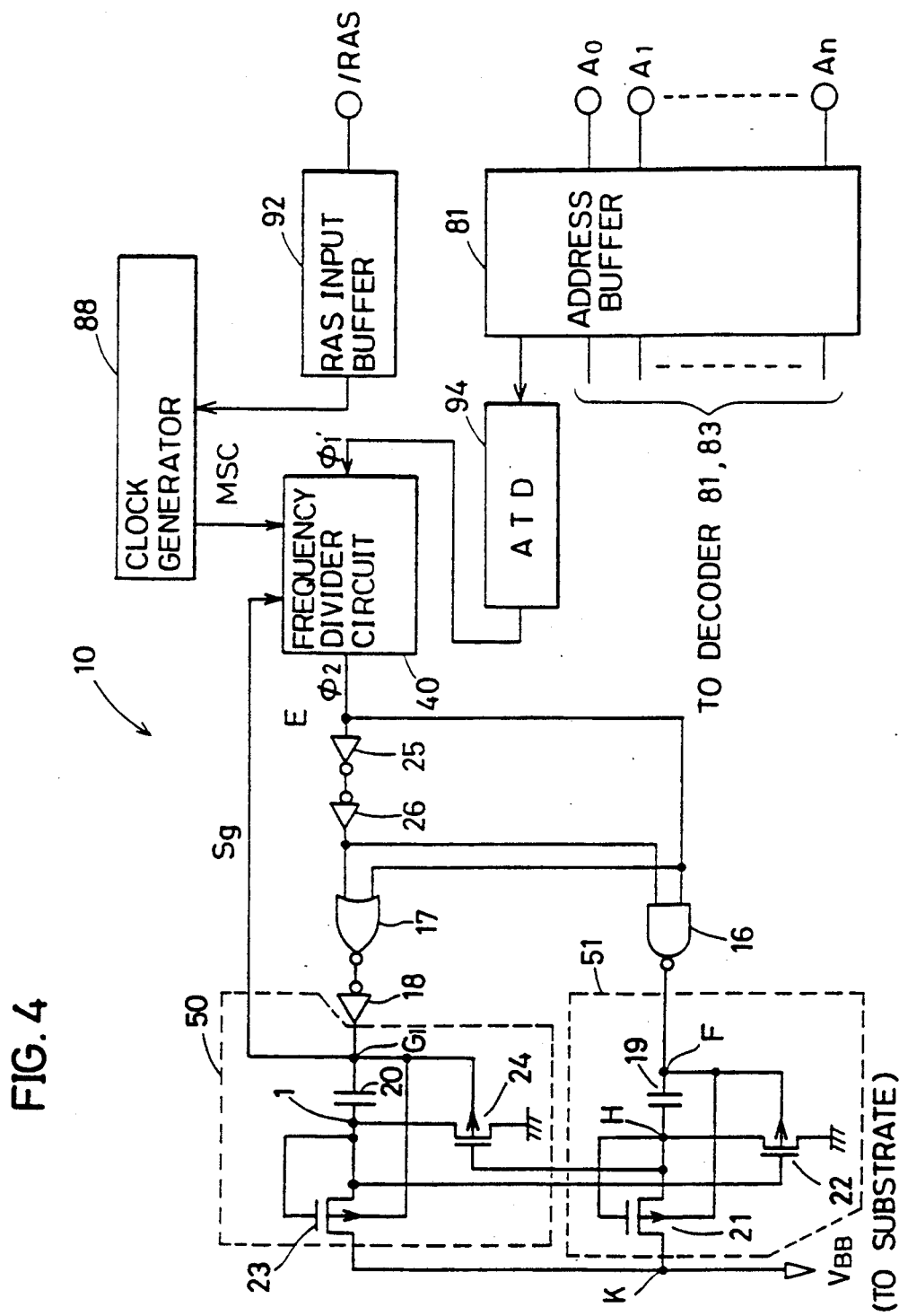
FIG. 4 is a circuit diagram of a substrate bias generating circuit showing another embodiment of the invention.
Figure 5:
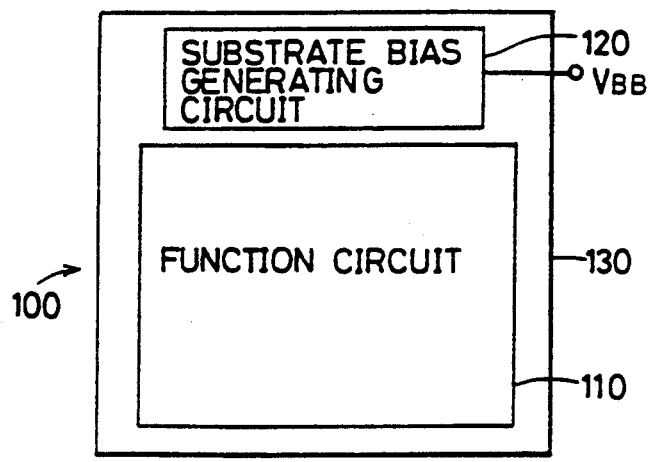
FIG. 5 is a block diagram of a general semiconductor integrated circuit device.
Figure 6:
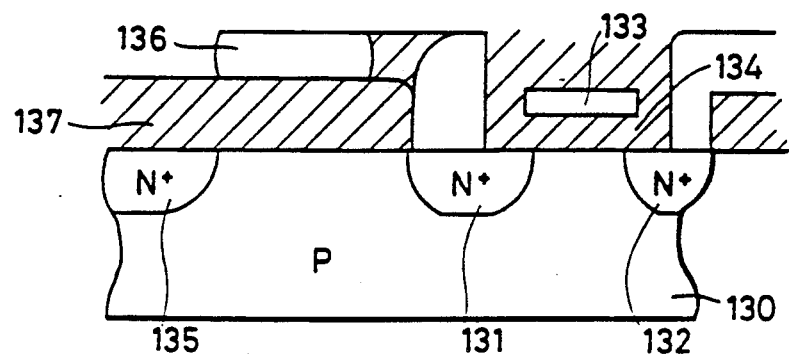
FIG. 6 shows a part of a cross sectional structure of a semiconductor integrated circuit device.

FIG. 4 is a circuit diagram of a substrate bias generating circuit showing another embodiment of the invention. Referring to FIG. 4, compared to the circuit shown in FIG. 1, an improved frequency division circuit 40 is provided in place of frequency division circuit 30. Frequency division circuit 40 receives an ATD pulse generated from an ATD circuit 94 as an input clock signal $\phi1'$. In addition, frequency division circuit 40 receives a static column mode signal /MSC generated from a clock generator 88. Therefore, frequency division circuit 40 divides input clock signal $\phi1'$ applied only in a static column mode in response to signal /MSC.

Figure 12:
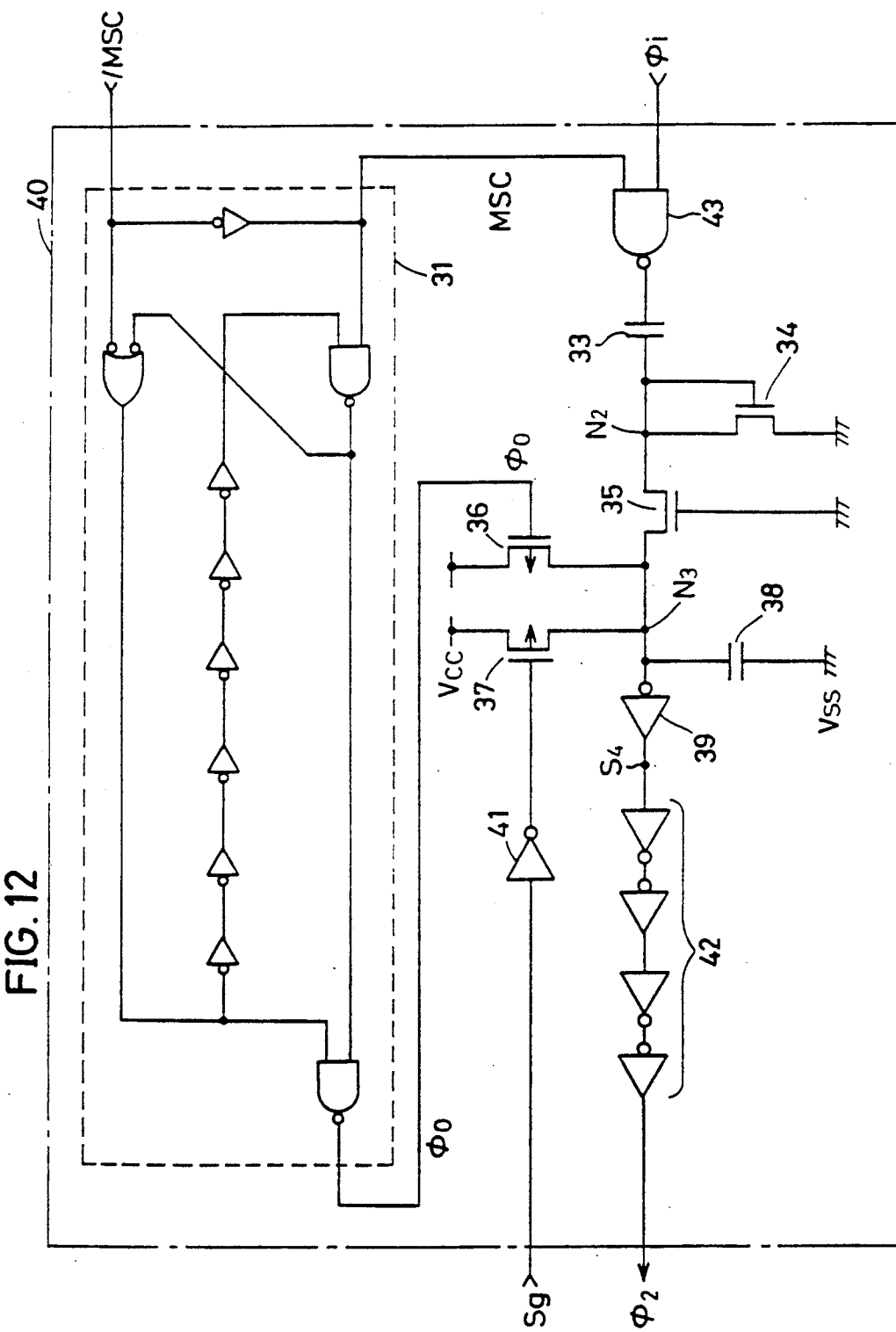
FIG. 12 is a circuit diagram of a frequency division circuit shown in FIG. 4.

FIG. 12 shows one example of the frequency division circuit shown in FIG. 4. Referring to FIG. 12, in comparison with frequency division circuit 30 shown in FIG. 2, a circuit 31 and a PMOS transistor 36 are added to the frequency division circuit 40 and a NAND gate 43 is provided with the circuit 40 in place of inverter 32. Circuit 31 generates a start pulse $\phi0$ when a static column mode is started. In addition, circuit 31 outputs a signal MSC obtained by an inversion of signal /MSC and applies it to one input of NAND gate 43 which has the other input connected to receive input clock signal $\phi1'$.

Referring again to FIG. 3, operation of frequency division circuit 40 shown in FIG. 12 will be described. When the static column mode is started, signal /MSC falls. Therefore, inverted signal MSC rises. NAND gate 43 passes applied input clock signal $\phi1'$ when signal MSC is at a high level. In other words, frequency division circuit 40 divides input clock signal $\phi1'$ and outputs divided clock signal $\phi2$ only in the static column mode.

Circuit 31 generates a negative initial pulse signal $\phi0$ in response to a falling edge of signal /MSC. Signal $\phi0$ is applied to the gate of transistor 36, so that transistor 36 is held on in a period when pulse $\phi0$ is negative. Therefore, immediately after the static column mode is started, a potential of node N3 is brought into a high level. The other circuit operations of frequency division circuit 40 shown in FIG. 12 are the same as that of circuit 30 shown in FIG. 2, and therefore the description is not repeated.

Figure 7:
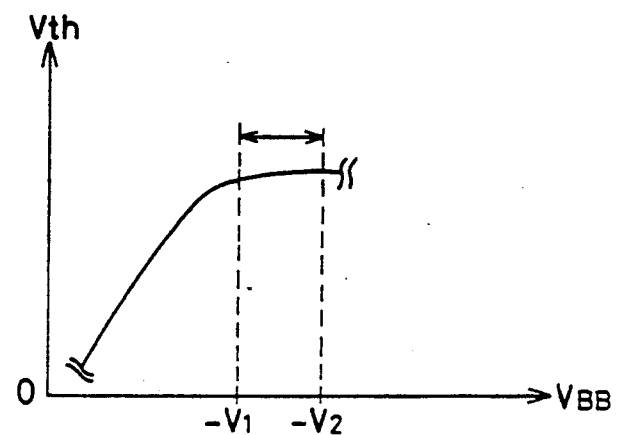
FIG. 7 is a graph showing a relationship between a threshold voltage of a MOS transistor and a potential of a substrate.

Ratios of division of frequency division circuits 30 and 40 shown in FIGS. 4 and 12 are determined by a threshold voltage of inverter 39 and a ratio of capacitance value of capacitors 33 and 38. The higher the frequency of clock signal $\phi2$ driving substrate bias generating circuit 10 becomes, the more power is consumed in circuit 10. On the other hand, if a frequency of clock signal $\phi2$ is too low, a semiconductor substrate cannot have a potential in a necessary range. Therefore, the ratios of frequency division of frequency circuits 30 and 40 shown in FIGS. 2 and 12 are set such that power consumed is minimized under the requirement that the substrate potential should be maintained in a predetermined range. A ratio of capacitance value of capacitors 33 and 38 and a threshold voltage of inverter 39 are set to satisfy the requirement. In other words, by newly providing a frequency division circuit 30 or 40, it is possible to keep a potential of a semiconductor substrate in a permissible range with less power consumed. A potential in a permissible range is, for example, as already described with reference to FIG. 7, a potential of at which MOS transistors provided within a semiconductor substrate can correctly operate.

Additionally, the following advantage is also pointed out. As described above, charge pump circuits 50 and 51 are driven alternately in response to an applied clock signal, that is, divided clock signal $\phi 2$. As an operation speed of a DRAM increases, generally, frequencies of signal /RAS and ATD pulse increase, so that a frequency of clock signal $\phi 2$ is generally increased. Therefore, charge pump circuits 50 and 51 should be operated at a high speed. By newly providing frequency division circuit 30 or 40, an operation speed needed for charge pump circuit 50 and 51 is decreased, and therefore efficiency of generation of substrate voltage $V_{BB}$ in these circuits 50 and 51 is improved. That is, charging/discharging of capacitors 19 and 20 provided in charge pump circuits 50 and 51 is carried out during a longer time period obtained by providing a frequency division circuit 30 or 40, so that it is possible to perform complete charge/discharge of capacitors 19 and 20.

In the above embodiment, a description of a case where the invention is applied to a DRAM was made; however, it is pointed out that the invention can be generally applied to a semiconductor memory and other semiconductor devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate bias voltage generating circuit, comprising:
   a semiconductor substrate;
   an internal circuit formed on said substrate;
   an internal clock signal generating means responsive to an externally applied clock signal for generating an internal clock signal for controlling said internal circuit;
   frequency divider means connected to receive said internal clock signal for dividing said internal clock signal by a predetermined ratio of division;
   substrate bias voltage generating means connected to an output of said frequency divider means and driven by the divided internal clock signal for generating a substrate bias voltage to keep a potential of said substrate in a predetermined range.

2. The substrate bias voltage generating circuit according to claim 1, wherein said predetermined ratio of division is so set that power consumed by said substrate bias voltage generating means is minimized under the requirement that the potential of said substrate should be kept in the predetermined range.

3. The substrate bias voltage generating circuit according to claim 1, wherein said substrate bias voltage generating means comprises charge pump circuit means driven by said divided internal clock signal for generating said substrate bias voltage.

4. The substrate bias voltage generating circuit according to claim 1, wherein said externally applied clock signal comprises a state control signal for controlling operation of said internal circuit.

5. The substrate bias voltage generating circuit according to claim 3, wherein
   said substrate bias voltage generating means further comprises a complementary clock signal generating means responsive to said divided internal clock signal for generating first and second complementary clock signals inverted to each other;
   said charge pump circuit comprises first and second alternate charge pump circuit means connected to receive first and second complementary clock signals, respectively, and responsive to the applied complementary clock signals for alternately generating said substrate bias voltage.

6. The substrate bias voltage generating circuit according to claim 4, wherein
   said state control signal comprises an externally applied row address strobe signal;
   said internal clock signal generating means comprises RAS input buffer circuit means connected to receive said row address strobe signal.

7. The substrate bias voltage generating circuit according to claim 1, wherein
   said externally applied clock signal comprises an externally applied address signal;
   said internal clock signal generating means comprises address transition detector means responsive to a transition of the applied address signal for generating an address transition detection pulse;
   said frequency divider means divides the address transition detection pulse by said predetermined ratio of division.

8. The substrate bias voltage generating circuit according to claim 1, wherein said internal circuit comprises a memory cell array, a sense amplifier and a row and a column decoder formed on said substrate for constituting a DRAM.

9. A semiconductor integrated circuit device, comprising:
   a semiconductor substrate;
   function circuit means formed on said substrate for implementing predetermined circuit functions;
   internal clock signal generating means responsive to an externally applied clock signal for generating an internal clock signal for controlling said function circuit means;
   frequency divider means connected to receive said internal clock signal for dividing said internal clock signal by a predetermined ratio of division; and
   a substrate bias voltage generating means connected to an output of said frequency divider means and driven by the divided internal clock signal for generating a substrate bias voltage to keep a potential of said substrate within a predetermined range.

10. The semiconductor integrated circuit means according to claim 9, wherein
    said semiconductor integrated circuit device comprises a semiconductor memory device;
    said externally applied clock signal comprises an externally applied state control signal for controlling a state of said function circuit means;
    said internal clock signal generating means generates said internal clock signal in response to the applied state control signal.

11. The semiconductor integrated circuit device according to claim 9, wherein
said semiconductor integrated circuit device comprises a semiconductor memory device;
said function circuit means comprises a memory cell array including memory cells provided in rows and columns;
said externally applied clock signal comprises an internally applied address signal for designating a memory cell provided within said memory cell array;
said internal clock signal generating means generates said internal clock signal in response to the applied address signal.

12. The semiconductor integrated circuit device according to claim 10, wherein
said semiconductor memory device comprises a dynamic random access memory device; and
said state control signal comprises a row address strobe signal.

13. The semiconductor integrated circuit device according to claim 11, wherein
said semiconductor memory device comprises a dynamic random access memory device;
said internal clock signal generating means comprises an address transition detector means responsive to the applied address signal for detecting a transition of the applied address signal and generating an address transition detection pulse as said internal clock signal.

* * * * *